United States Patent [19]

Clark et al.

[11] Patent Number: 5,502,711
[45] Date of Patent: Mar. 26, 1996

[54] DUAL DIGITAL PHASE LOCKED LOOP CLOCK CHANNEL FOR OPTICAL RECORDING

[75] Inventors: Alan R. Clark; Robert A. Hutchins, both of Tucson, Ariz.; Ara S. Patapoutian, Westboro, Mass.

[73] Assignee: International Business Machines Corporation, Armonk, N.Y.

[21] Appl. No.: 407,124

[22] Filed: Mar. 20, 1995

[51] Int. Cl.⁶ ........................................ G11B 7/00
[52] U.S. Cl. .................. 369/124; 369/59; 369/44.34; 360/51
[58] Field of Search .................. 369/124, 59, 44.28, 369/44.34; 360/51; 359/264, 279

[56] References Cited

U.S. PATENT DOCUMENTS

| | | | |
|---|---|---|---|
| 4,734,900 | 3/1988 | Davie | 369/59 |
| 5,034,940 | 7/1991 | Saito et al. | 369/44.34 |
| 5,050,146 | 9/1991 | Richgels et al. | 369/44.28 |
| 5,224,089 | 6/1993 | Matsumura et al. | 369/124 |
| 5,235,590 | 8/1993 | Taguchi et al. | 369/124 |
| 5,309,418 | 5/1994 | Suzuki | 369/44.28 |

FOREIGN PATENT DOCUMENTS 57-203213  12/1982  Japan.
04-366426  12/1992  Japan.

*Primary Examiner*—Loha Ben
*Attorney, Agent, or Firm*—Homer L. Knearl; D. A. Shifrin

[57] ABSTRACT

A digital phase lock loop channel is provided for threshold detection of a pulse width modulated binary data stream that has negative and positive transitions defining one binary state of the data stream. A threshold-establishing and transition-detecting network receives this data stream and provides a first output of one polarity corresponding to the detection of a positive transition, a second output of an opposite polarity corresponding to the detection of a negative transition, and a time-of-arrival output corresponding to a positive and a negative transition. A first and a second digital PLL is provided, each PLL having a transition input, a time-of-arrival input, a phase-error input, a phase error output a data-valid output, and a data output. Each PLL has an internal digital phase detector network connected to receive its transition input and its time-of-arrival input, and each PLL is operable to generate the phase error output therefrom. Each PLL has an internal digital loop filter connected to receive the phase error output generated by its phase detector network, and to receive the phase error output that is generated by the other PLL. The output of the loop filter of each PLL is connected to the data-valid and data outputs of its respective PLL.

17 Claims, 10 Drawing Sheets

FIG. 1E   1 0 0 1 0 1 1   "OR" ED OUTPUT SIGNAL

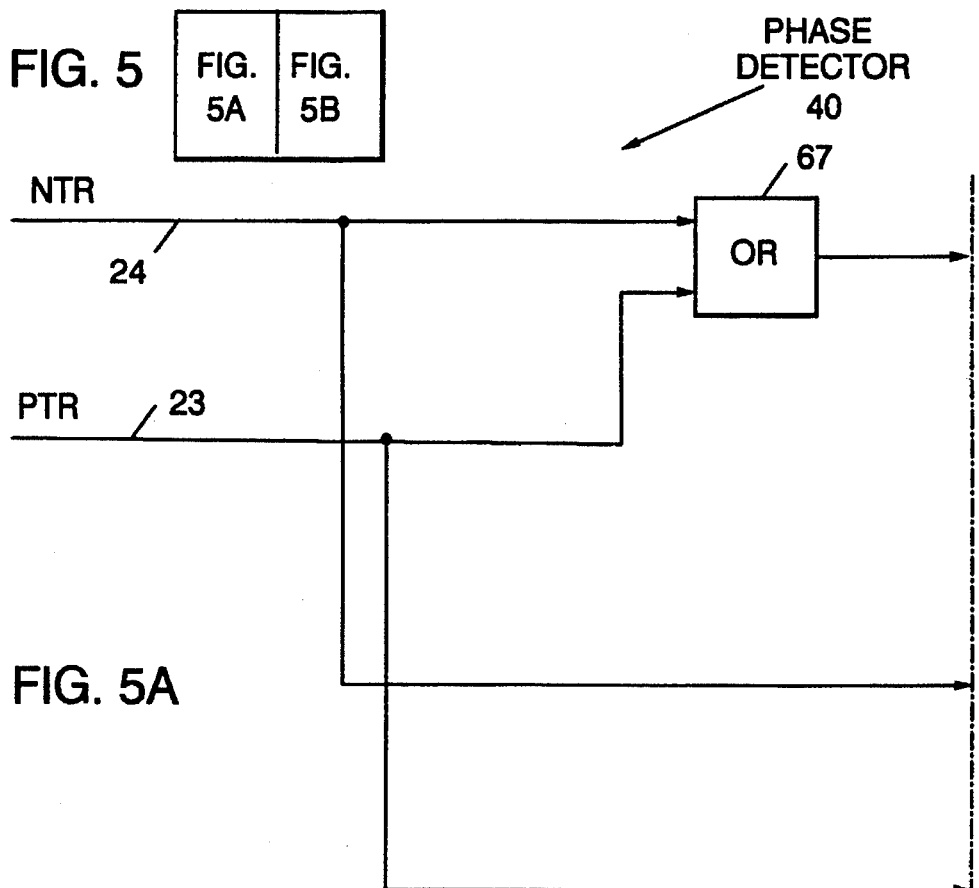

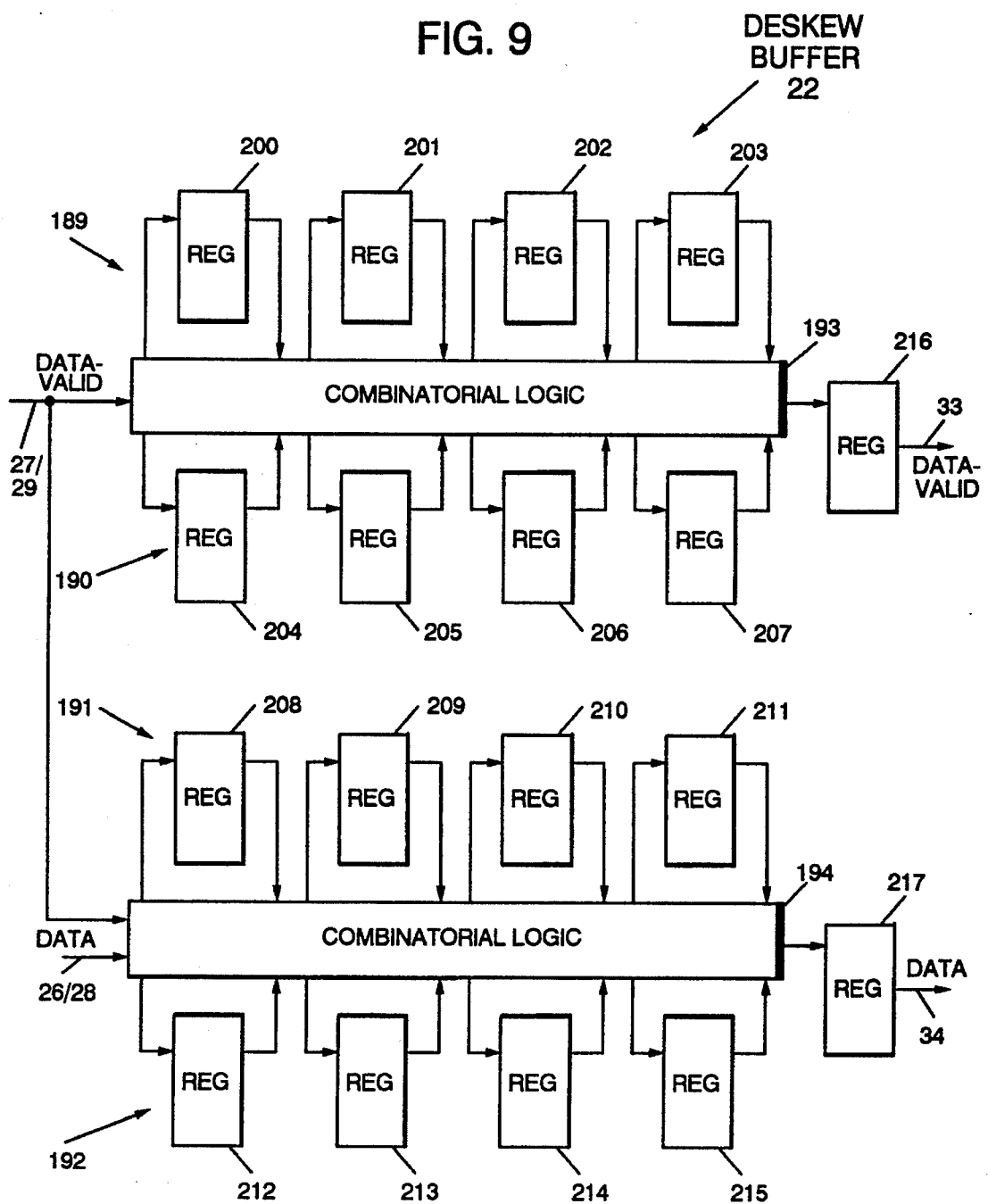

DUAL DIGITAL PHASE LOCKED LOOP CLOCK CHANNEL FOR OPTICAL RECORDING

CROSS REFERENCE TO RELATED APPLICATIONS

U.S. patent application Ser. No. 08/097,503, now U.S. Pat. No. 5,442,315 entitled "Bit Stream Rate Asynchronous Digital Phase Lock", filed Jul. 27, 1993, incorporated herein by reference.

The present invention is used in the invention described in, commonly-assigned U.S. patent application Ser. No. 08/407,125, entitled "Data Transition Threshold Following In Optical Recording" and filed concurrently herewith. The description of this cross-referenced application is incorporated herein by reference.

BACKGROUND OF THE INVENTION

1. Field of the Invention

This invention relates to the field of digital recording on optical recording media such as optical disks, to signal detection techniques for this digital recording, and to signal detection techniques for Pulse Width Modulation (PWM) optically recorded digital data.

2. Description of the Related Art

When data is recorded on optical recording media such as on optical recording disks using PWM recording techniques, the edges of the recorded data pits, or the edges of the recorded magnetic domains, can physically shift position, for example due to thermal blooming effects of the disks. This edge shift causes read detection errors due to incorrectly set signal detection thresholds. It is noted, however, that the detected negative and positive signal edges will shift generally the same physical amount when the detection threshold is incorrectly set.

PWM data recording is well known and comprises a recording method whereby a signal transition in a bit cell time interval comprises a selected one of a binary 1 or a binary 0, whereas the lack of a signal transition in a bit cell time interval comprises the other of the two possible binary states 0 and 1. Since a no signal transition state in a bit cell carries data information, it is necessary that a detection clock be provided to accurately define the detection bit cell intervals. This detection clock signal must be synchronized with the bit cell interval that was used when the signal was originally recorded, i.e. when the PWM data was originally written on the optical media.

Optical recording provides special problems relative to synchronizing this detection clock to the original writing clock. For example, the physical properties of conventional optical recording media provide that the information or data that is recorded on or into the media can change in physical size, be it movement of the leading and/or trailing edges of a pit that is formed into the media that cause light to be reflected to a data detector, or be it the physical size or length of a magnetic or an opto-magnetic property that is written into the media. As a result of this physical movement of recorded data on the optical media, use of the leading and/or trailing edges of the recorded data to generate a detection clock is complicated.

The present invention provides a data channel that operates to eliminate edge shift in the detection signal by employing a clock channel having two digital Phase Locked Loops (PLLs). An advantage of the invention is that its digital channel configuration can be easily implemented and controlled by the use of digital logic.

While the use of dual clock channels is known in optical devices, this use has been restricted to use in dual analog clock channels.

In addition, it is known that others have provided an adaptive signal detection thresholding feature in a digital channel. However, the art has not provided a dual digital phase locked loop channel for optical recording.

The following U.S. Patents are of general interest relative to the present invention.

U.S. Pat. No. 4,734,900 describes an optical recording apparatus wherein an unintended width variation in PLM data is eliminated by the use of a phase locked loop. The apparatus restores and clocks PWM data in a data channel during either writing or reading of the data. More specifically, the leading and trailing edges of PWM data are monitored to detect any variations in the expected pulse width. When a variation is detected, the pulse width is restored to the expected pulse width by operation of a phase locked loop.

In one embodiment of U.S. Pat. No. 4,734,900, a phase locked loop keeps the leading edge in proper phase with a data clock signal, and a width correction signal moves the trailing edge into proper phase relationship with the data clock signal.

In another embodiment of U.S. Pat. No. 4,734,900, a counter counts pulses of a clock between leading and trailing edges of signals that chronologically represent detected leading edges and trailing edges of pulses from PWM data. A count that is representative of the expected count is subtracted from the counter content, and a low pass filter and scaler operate to generate a signal that is a measure of width variation. This width variation signal is used to control a double phase locked loop arrangement in the form of two phase shifters; i.e., a minus phase shifter and a plus phase shifter. These two phase shifters then provide phase shifts for independent clocks in their loops. These clocks being used to detect the leading and trailing edges of pulses respectively.

U.S. Pat. No. 5,235,590 describes read out apparatus for use with magneto optic recording media. In its description of prior art U.S. Pat. No. 5,235,590 describes an arrangement wherein a first PLL generates a first clock signal that is synchronized to the leading edge of a read signal, and wherein a second PLL generates a second clock signal that is synchronized to the trailing edge of the read signal. By way of two data separators, a synthesizing device, and a decoder, a non return to zero code signal is generated from the read signal.

In a first embodiment of U.S. Pat. No. 5,235,590, an arrangement that includes a delay line operates to delay the leading edge of a read signal, and a synthesized signal is generated whose rising edge corresponds in time to the rising edge of the delayed leading edge signal, and whose falling edge corresponds in time to the trailing edge of original read signal.

In a second embodiment of U.S. Pat. No. 5,235,590, an arrangement that includes a read signal integrator operates to make a judgement as to the domain lengths that are being read. This judgement signal is then used to correct the edge positions which are obtained from the read signal.

In third, fourth and fifth embodiments of U.S. Pat. No. 5,235,590, two delay lines are provided. One delay line provides a fixed delay, whereas the second delay line provides a delay that is determined by integrating the read out signal. An edge detector responds to the read out signal and operates to apply a trailing edge detection signal to the fixed delay line, and to apply a leading edge detection signal to the variable delay line. The two outputs of the two delay lines are used to generate a digital read out signal whose leading edge is subject to a variable delay and whose trailing edge is subject to a fixed delay.

U.S. Pat. No. 5,309,418 makes use of a PLL in an optical disk track counting arrangement wherein a tracking error signal is applied to the PLL. This signal is compared to the signal that is generated by the PLL so as to synchronize the phase between these two signals. A counter counts the number of tracks based upon the synchronized PLL signal.

Japanese documents JO43664426 and J57203213 are of general interest in that they utilize leading and trailing edge detection and PLLs.

While the art as exemplified by the above noted U.S. patents has been generally satisfactory for its limited intended purposes, the need remains in the art for an optical recording signal detection channel that eliminates edge shift in its read signal by the use of a clock channel having two digital PLLs.

SUMMARY OF THE INVENTION

It has been shown that the use of a threshold detection channel when reading PWM recorded media in the field of optical recording yields an improvement of about 6 dB in the signal to noise ratio when compared to the use of a peak detection channel. However, in order to realize this S/N ratio advantage by the use of threshold detection two problems must first be solved. First a solution must be provided to the sensitivity problem that the threshold detection channel exhibits to the physical position of the tracking threshold relative to the received or read signal waveform. Second, the effect that the optical media's thermal blooming has on the physical position of the trailing edge of the media's recorded patterns must be solved.

The dual digital PLL clock design of the present invention effects a reduction in the sensitivity of a threshold detection channel to both thermal blooming and tracking threshold variation by providing a construction and arrangement whereby one digital PLL tracks the rising edges of the recorded marks, and the other digital PLL tracks the falling edges of the recorded marks.

Given a read PWM waveform that is equalized for threshold detection, deviation of the position of the PWM read signal from the center of a bit cell is very small when the threshold or tracking threshold is in the optimal position. The optimum position of the tracking threshold is typically set to be at the average of the read signal, and more generally the tracking threshold is set so that transitions or threshold crossings occur generally in the center of a bit cell. However, as the PWM read signal waveform moves relative to the tracking threshold, the positions of threshold crossing physically move. If the threshold is set at a high magnitude, the physical location where the read signal Positive Transitions (PTRs) cross this high threshold is time delayed, and the location where the read signal Negative Transitions (NTRs) cross this high threshold occur at an earlier time. If the threshold is set at a low magnitude, the signal's PTRs arrive early and signal's NTRs arrive late. If both PTR and NTR are provided as input to a single prior art PLL, these variations in threshold crossing time act as noise at the input of the PLL, thus increasing the PLL's phase error jitter. The prior art single PLL then operates to position the center of the bit cell between these two arrival times. This operates to reduce the margin to failure for a given edge by reducing the distance that exists between that edge's threshold crossing time and the corresponding edge of a bit cell.

With the dual digital PLL construction and arrangement of the present invention, one digital PLL tracks the read signal's PTR and the other digital PLL tracks the read signal's NTR. If the tracking threshold is set at a high magnitude, the read signal's PTR again arrives late, but its tracking digital PLL now adjusts the bit cell so that the signal's PTR remains in the center of the adjusted bit cell. Likewise, as the read signal's NTR arrives early, its tracking digital PLL adjusts the bit cell to keep the signal NTR in the center of the adjusted bit cell. As a result, the invention operates to maximize the margin between read signal transition arrival times and the edge of the bit cell, thus improving detection reliability. Also, the invention operates to reduce phase error jitter into each of the two digital PLLs, and thus allows the full benefit of a threshold detection PWM channel to be realized. While the invention will be described relative to the reading of previously recorded data, the invention has equal utility in applications such as read-after-write recording.

Another problem in optical recording is the physical lengthening of a recorded mark due to thermal blooming of the recording media. In a detection system that is not properly calibrated, the physical positions of the trailing edge of this lengthened recorded mark vary, causing a variation or jitter in the read signal's NTR. With the dual digital PLL system of this invention one digital PLL tracks the read signal PTRs and operates to optimally position the bit cell relative thereto so as to provide for a stable edge in the read signal waveform. The other digital PLL now tracks the read signal's NTR and physically positions the bit cell so as to minimize phase jitter.

As a feature of the invention, the dual PLL architecture is implemented in digital technology. Thus, phase error information is easily shared between the two digital PLLs, programmable coefficients of the digital PLLs are easily set for the tracking and reading modes, the PLL center frequency is easily selected instantaneously, and each digital PLL's reset and open loop states are clearly defined relative to the other digital PLL.

In accordance with the invention, the NTR and PTR transition signals are used to update both the frequency and the phase of the PLL that received the signal. More specifically, when one PLL generates a phase error signal, this phase error signal is used by that PLL to update its own frequency and its own phase, and in addition this phase error is used to update the frequency of the other PLL.

An object of the invention is to provide a digital phase locked loop channel for use in the threshold detection of a pulse width modulated binary data stream wherein the data stream has negative and positive transitions that define one binary state of the data stream. A threshold-establishing and transition-detecting network receives this data stream and provides a first output of one polarity corresponding to the detection of a positive transition, and provides a second output of an opposite polarity corresponding to the detection of a negative transition, and additionally provides a time-of-arrival output corresponding to a positive and a negative transition. A first and a second digital PLL network is provided, each having a transition input, a time-of-arrival input, a phase-error input, a phase error output a data-valid output, and a data output.

Each of the first and second PLLs has an internal digital phase detector network connected to receive inputs from its transition input and its time-of-arrival input, and each PLL is operable to generate the above stated phase error output therefrom.

Each of the first and second PLLs has an internal digital loop filter connected to receive the phase error output that is generated by its phase detector network, and to receive a phase error output that is generated by the other PLL.

The output of the digital loop filter of each of the first and second PLLs is connected to the data-valid and data outputs of its respective PLL.

The first output of the threshold-establishing and transition-detecting network is now connected to the transition input of the first PLL, the second output of the threshold-establishing and transition-detecting is now connected to the transition input of the second PLL, and the time-of-arrival output of the threshold-establishing and transition-detecting network is now connected to the time-of-arrival inputs of the first and second PLLs.

Finally, a digital deskew buffer is connected to receive the data-valid and data outputs of the first and second PLLs. This deskew buffer operates to perform a logic OR function on the data-valid and data outputs of the first and second PLLs.

These and other features, objects and advantages of the invention will be apparent to those of skill in the art upon reference to the following detailed description, which description makes reference to the drawing.

BRIEF DESCRIPTION OF THE DRAWING

FIG. 1E shows the detected output signal that is generated when the signals of FIGS. 1C and 1D are logically ORed into bit cell intervals.

FIG. 5, comprising FIG. 5A and FIG. 5B, is a detailed showing of the phase detector that is shown in FIG. 4; i.e., a showing of the phase detector that is contained in each of the two PLLs shown in FIG. 3.

FIG. 9 shows the logic structure of the deskew buffer that is contained in FIGS. 2 and 3.

DETAILED DESCRIPTION OF THE INVENTION

Figure 1A:
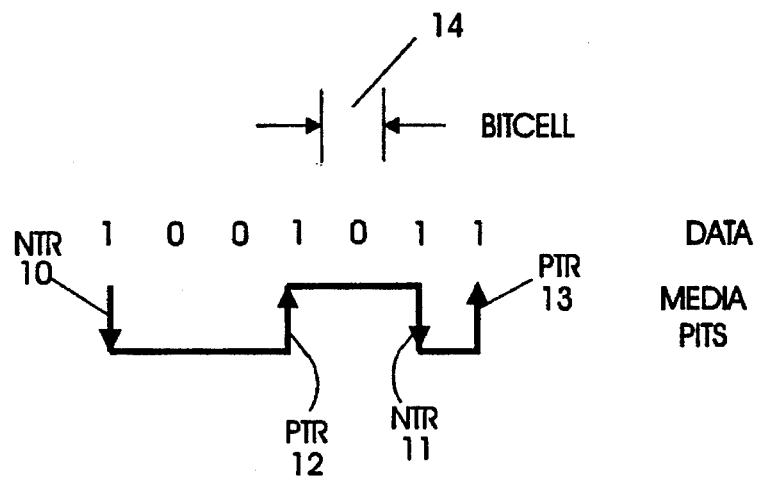
FIG. 1A provides a representative binary data pattern 1001011 to be optically recorded, and shows the corresponding pits that are recorded into the surface of optical recording media as a result of this data pattern using PWM recording techniques.

FIG. 1A shows a representative binary data pattern "1001011" that is to be recorded on optical media, as well as the corresponding media pits that are recorded into optical recording media such as an optical disk (not shown) when using the well-known PWM recording technique. While this invention has utility when optically recording using other recording techniques such as pulse position modulation (PPM), the invention will be described when making reference primarily to PWM recording.

At the occurrence of each binary 1 in the example data pattern "1001011", an edge of a media pit occurs. Thus, Negative Transition (NTR) edges 10 and 11 define the leading edges of two media pits, and positive transition (PTR) edges 12 and 13 define the trailing edges of these two media pits.

Figure 1B:
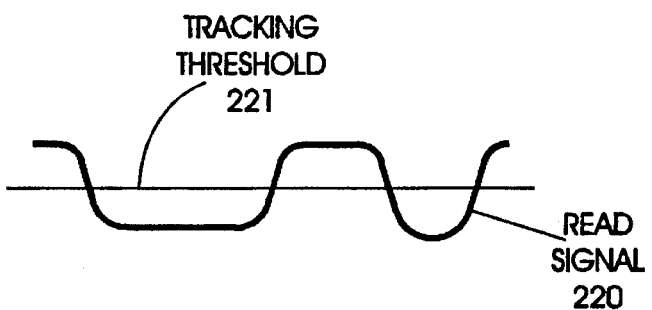
FIG. 1B provides a showing of an electrical read signal that is generated when the media pits of FIG. 1A that are read, and additionally shows a tracking threshold level that is used to threshold detect the transitions within this read signal.
Figure 1C:
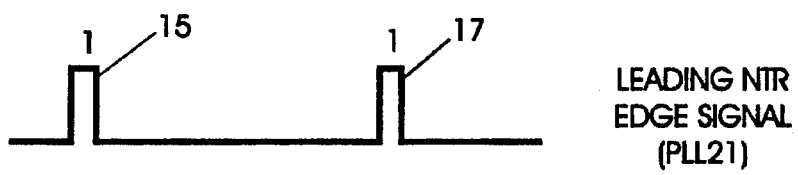
FIG. 1C shows the leading edge NTR electrical signals that are generated from the read signal of FIG. 1B.
Figure 1D:
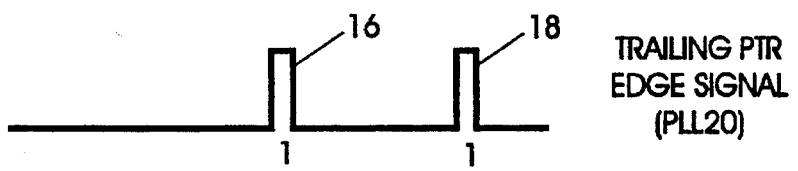
FIG. 1D shows the trailing edge PTR electrical signals that are generated from the read signal of FIG. 1B.

When the pit pattern of FIG. 1A is read off of the optical disk, in a manner well known to those of skill in the art, an electrical read signal 220 generally as shown in FIG. 1B is generated. Threshold detection of this read signal is provided by the use of tracking threshold 221. More specifically, as read signal 220 crosses threshold 221, an NTR or a PTR signal shown, in FIGS. 1C or 1D, is generated. As can be appreciated, as the magnitude of threshold 221 varies; i.e., as threshold 221 moves up or down in FIG. 1B, the position at which the NTR or the PTR signal occurs within its bit cell varies.

In accordance with the invention, a first digital Phase Locked Loop (PLL) responds to the leading edge NTR electrical signals 15,17 shown in FIG. 1C, and a second digital PLL responds to the trailing edge PTR electrical signals 16,18 shown in FIG. 1D.

In FIG. 1A, time interval 14 represents a bit cell time interval. As will be apparent, bit cell intervals 14 are established by the operation of a phase integrator 47 that is within each of the two PLLs 20,21.

As seen from FIGS. 1C and 1D, signal pulses 15–18 provide for the detection of the four binary is that are contained in the original recorded data "1001011" of FIG. 1A, this detection occurring in the corresponding first, fourth, sixth and seventh bit cell intervals 14. In accordance with the PWM recording scheme, all bit cells 14 of FIGS. 1C and 1D during which an NTR or PTR signal transition does not occur are detected or decoded as a binary 0 in the read data pattern.

When the signals of FIGS. 1C and 1D are logically Ored into bit cell intervals 14, the detected output signal pattern "1001011" of FIG. 1E is provided from the original read signal of FIG. 1B.

Figure 2:
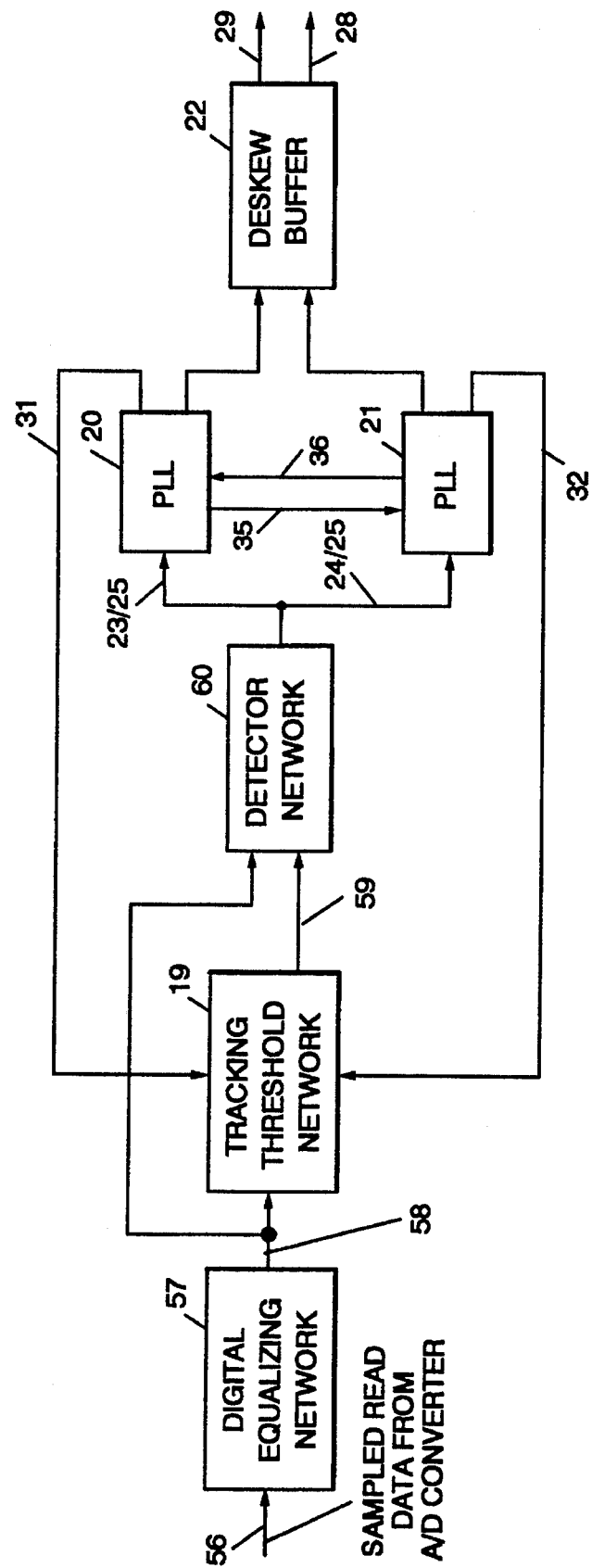
FIG. 2 is a block diagram showing of a read detection channel that includes the present invention.

FIG. 2 is a block diagram showing a read detection channel that includes the present invention. In this arrangement a conductor 56 provides a sampled digital read data signal that is provided from an analog to digital converter (not shown). Digital signal 56 is provided to the input of digital equalizing network 57. The digital output 58 of equalizing network 57 is provided as an input to a tracking threshold network 19, and to a detector network 60.

Tracking threshold network 19 operates to provide an estimate of a centerline magnitude value (221 of FIG. 1B)

that lies midway between the maximum and the minimum magnitude values of the digital equalized data 58 output of equalization network 57. This centerline value is added to the output of a phase feedback detection network (not shown) that is within tracking threshold network 19. In this manner a detection threshold output 59 is provided as a second input to detector network 60.

Threshold output 59 and output 58 are used by detector network 60 in determining the bit cell positions whereat the NTR and PTR transitions shown in FIG. 1A occur. In essence, tracking threshold value 59 is subtracted from equalizer output 58, and a comparison is provided by detector network 60. If two time adjacent data samples of signal 58 are of opposite polarity, then a PTR or NTR transition, or a or "1", has occurred within the corresponding bit cell, such as 14 of FIG. 1A.

Detector network 60 estimates the location of the PTR, NTR transition within bit cell 14 by using first-order linear interpolation. As will be described in greater detail relative to FIG. 3, detector network 60 then operates to send NTR/PTR and PAT outputs 23/25 and 24/25 to the two PLLs 20 and 21.

As a feature of the present invention, each of the two PLLs 20,21 provides a phase error signal 31,32 as two additional inputs to tracking threshold network 19. Phase error signals 31,32 operate to lock tracking threshold signal 59 to the correct level, this being an important consideration for the detection of PWM optically written data.

Figure 3:
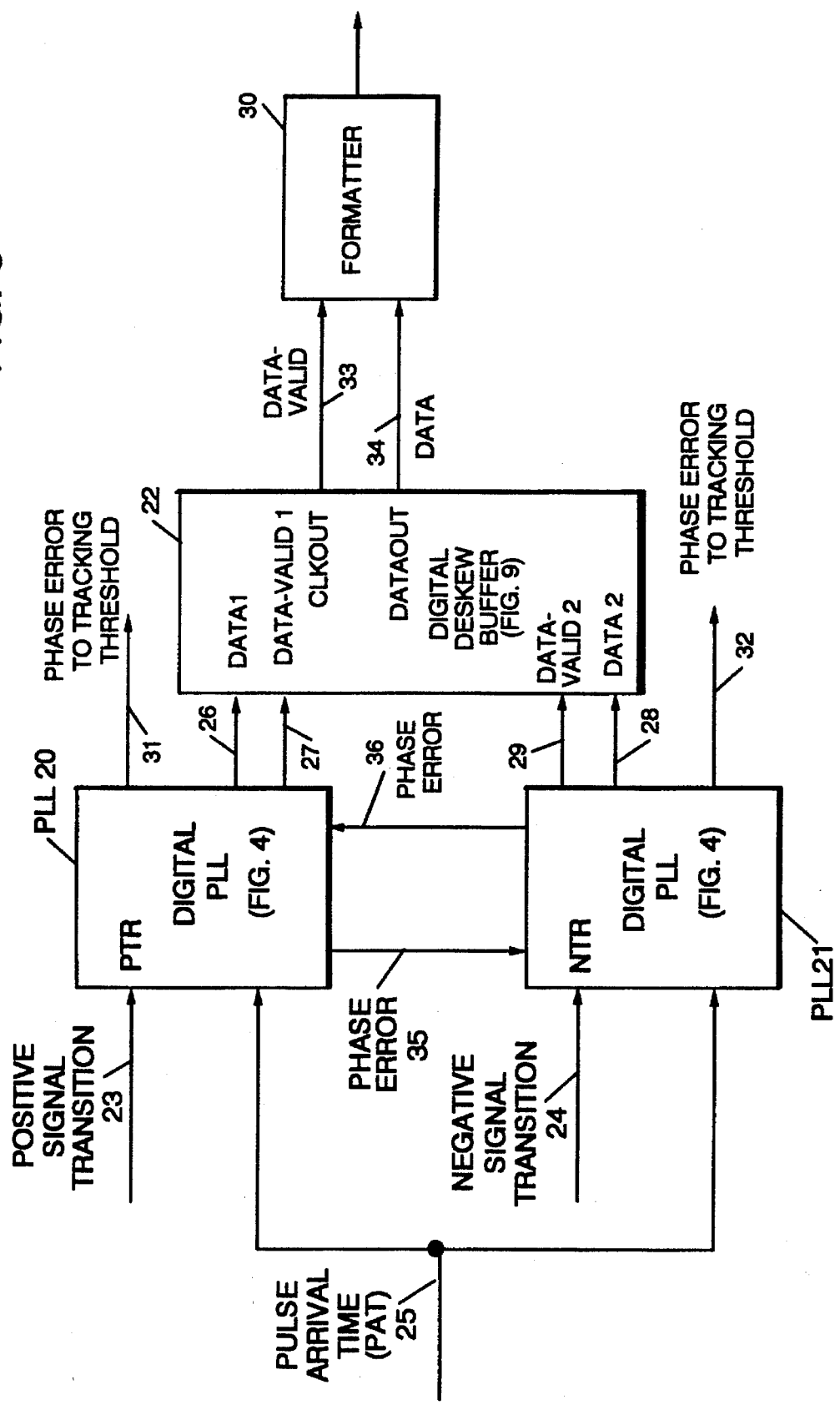
FIG. 3 provides a block diagram showing of the first digital PLL, the second digital PLL, and the digital deskew buffer of FIG. 2.

FIG. 3 provides a more detailed block diagram of the portion of FIG. 2 that includes first digital PLL 20, second digital PLL 21, and digital deskew buffer 22. The PTR signal pattern of FIG. 1D is applied as one input 23 to PLL 20, and the NTR signal pattern of FIG. 1C is applied as one input 24 to PLL 21. Each of the PLLs 20,21 receives a pulse arrival time signal (PAT) 25 as a second input. PAT signal 25 provides information relative to exactly where within a sample cell the NTR transition or the PTR transition occurred, wherein the sample cell intervals themselves are determined by a fixed frequency sampling clock or oscillator (not shown). As an example, this sample cell clock rate is set to run at about 1.3 times the FIG. 1A data rate. PTR and NTR signals 23,24 can also be called PTR qualifier and NTR qualifier signals, respectively.

Figure 6:
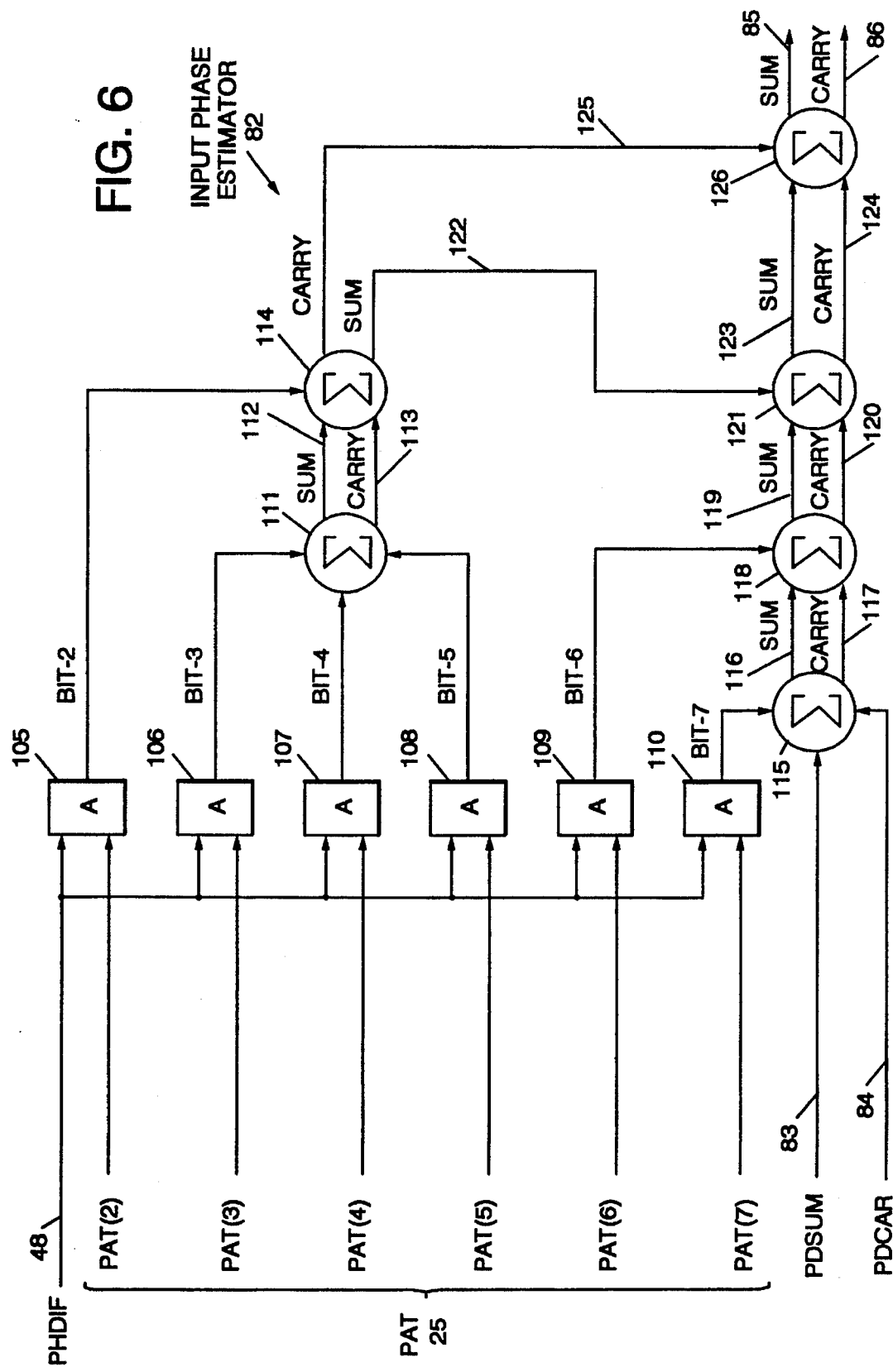
FIG. 6 is a block diagram showing of the input phase estimator shown in FIG. 5.

By way of example, PAT signal 25 may comprise a 4-bit binary number, or alternatively a 6-bit number as shown in FIG. 6, where the lowest value "0000" designates that the PTR/NTR signal transition occurred at one edge of sample cell, where the highest value "1111" designates that the signal transition occurred at the other edge of the sample cell, and where the mid range value "0111" designates that the signal transition occurred generally in the center or middle of the sample cell.

In accordance with the invention, PLL 20 tracks the rising edge (PTR) of the optical media pits of FIG. 1A, and PLL 21 tracks the falling edge (NTR) of these recorded or written media pits.

The operation of PLLs 20,21 provides two independent binary streams called "data-valid" and "data". These two data streams are created and sent to digital deskew buffer 22. Thus, PLL 20 generates a data-1 signal 26 and a data-valid-1 signal 27, as PLL 21 generates a data-2 signal 28 and a data-valid-2 signal 29. As additional outputs, PLLs 20,21 provide two phase error signals 31,32 to a phase error tracking threshold network 19 of FIG. 2.

Deskew buffer 22, shown in detail in FIG. 9, operates to align PTR data signal 26 and NTR data signal 28 with data-valid signals 27 and 29. Stated in another way, deskew buffer 22 operates to monitor the transition and pulse arrival time signals on the two inputs of each PLL input. Deskew buffer 22 then operates to generate an output data signal 34 and a data-valid signal 33 only when corresponding data and data-valid signals have been received on the inputs of the two PLLs 20,21. In this manner, deskew buffer 22 operates to match the data-valid signals and the data signals that are received by each PLL, one-for-one. Deskew buffer 22 thus operates to generate a single serial set of data-valid and data output signals 33,34 which are sent to a well known signal formatter 30 whereat the original optically recorded binary data pattern is recovered.

Figure 4:
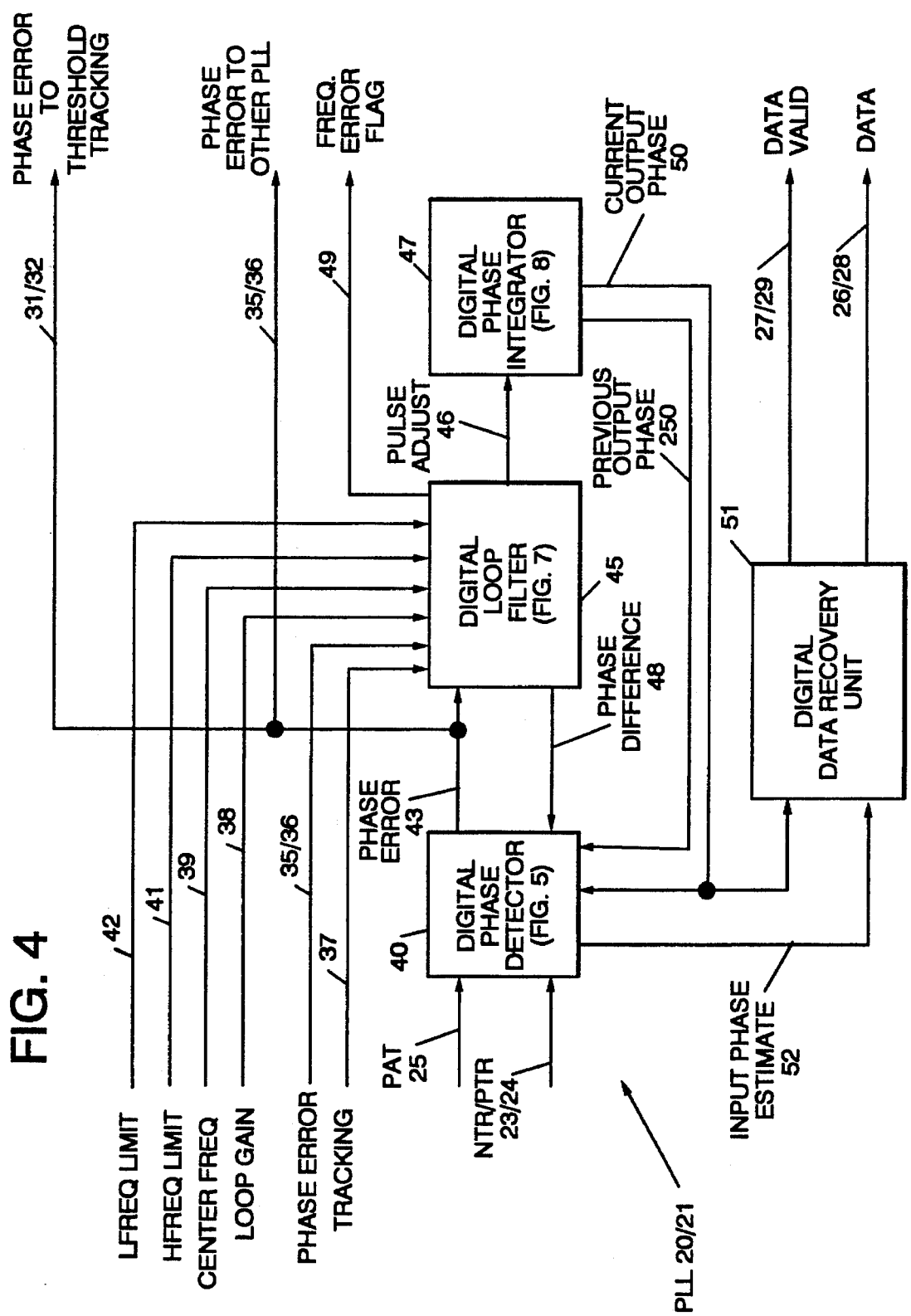
FIG. 4 shows the construction and arrangement of one of the two identical digital PLLs of FIG. 3.

As a feature of the invention, and as will be shown relative to a description of FIG. 4, each of the PLLs 20,21 develops a phase error signal 35,36 and provides this signal as an input to the frequency integrator portion of the loop filter 45 (see FIGS. 4 AND 7) that is within the other one of the two other PLLs 20,21. Thus, the phase error that is detected by PLL 20 is provided to PLL 21 by way of conductor 35, and the phase error that is detected by PLL 21 is provided to PLL 20 by way of conductor 36. Phase error signals 35,36 operate to cause the operating frequency of each of the PLLs 20,21 to be identical. The phase error signal that is thus received by one PLL from the other PLL is processed only in the frequency portion of the one PLL, and not in the phase portion of the one PLL. In this way the two PLLs 20,21 are frequency locked, but individual phase adjustment can occur as needed.

Stated in another way, each of the two PLLs 20,21 outputs its phase error signal to the other PLL, and since this phase error signal goes only to the frequency adjustment portion of the loop filter 47 that is within the other PLL (see FIGS. 4 and 7), the frequency of each of the PLLs 20,21 is substantially identical. This effect operates to keep the phase of each PLL close to the phase of the other PLL, and thus keeps the frequency of the PLLs from drifting apart during reading in the area of disk defects, or during other conditions resulting in open loop operation.

FIG. 4 shows the construction and arrangement of one of the two identical digital PLLs 20,21 of FIGS. 2 and 3. Each PLL 20,21 consists of four major functions; i.e., phase detector 40, loop filter 45, phase integrator 47, and data recovery unit 51, all of which are implemented using digital techniques and are highly pipelined to minimize propagation delay between the registers of FIG. 4.

In each of these PLLs, a digital phase detector 40 (shown in detail in FIG. 5) receives the 4-bit PAT signal on input conductor 25, and receives a NTR or PTR transition signal on input conductor 23/24. Phase detector 40 operates on these two signals, as well as on signal 50 (current output phase), signal 250 (previous output phase), and signal 48 (phase difference). As a result phase detector 40 generates or detects the phase error that exists between the arrival time of the NTR/PTR signal 23/24 and its respective PAT signal 25. This phase error signal 43 is provided as an input to a digital loop filter 45 (shown in detail in FIG. 7). Phase error signal 43 is also provided to the digital loop filter 45 of the other of the two PLLs by way of a conductor that is designated 35/36. This phase error feedback from the other PLL is shown in FIG. 4 by way of an input signal 35/36 that is provided as an input to FIG. 4's digital loop filter 45. In addition, phase error signal 43 is provided to tracking threshold network 19 of FIG. 2 by way of conductor 31/32.

A number of other inputs are preferably provided to digital loop filter 45. A signal 37 indicates to loop filter 45 that the device is in a tracking mode of operation whereat data is not being acquired. A signal 38 operates to set the gain of loop filter 45. A signal 39 operates to set the center operating frequency of loop filter 45. A signal 41 operates to set the high frequency limit of loop filter 45. A signal 42 operates to set the low frequency limit of loop filter 45.

Digital loop filter 45 provides three output signals in response to the above noted input signals. First, a phase adjust signal 46 is provided to digital phase integrator 47 (shown in detail in FIG. 8). Second, a phase difference signal 48 is provided to phase detector 40. Third, a frequency error signal or interrupt flag 49 is generated, as will be described relative to FIG. 7, when a frequency error is detected. Flag 49 can be used, for example, to stop data recovery operation.

Phase integrator 47 operates on phase adjust signal 46 to generate a signal on conductor 50 that contains information as to the current output phase, wherein the term current output phase refers to the phase at the current sample time. Signal 50 is provided as an input to phase detector 40 and as an input to a digital data recovery unit 51 of well known construction and arrangement, digital data recovery unit 51 being described in detail in the above referenced and copending patent application.

Phase integrator 47 operates on phase adjust signal 46 to generate a signal on conductor 250 that contains information as to the previous output phase, wherein the term previous output phase refers to the phase at the time of the previous sample time. Signal 250 is provided as an input to phase detector 40.

As a result of receiving signal 50, digital phase detector 40 operates to generate an input phase estimate signal 52 that is applied as an input to data recovery unit 51. In addition, data recovery unit 51 generates data signals 26,28 and data-valid signals 27/29 that are shown as outputs of PLLs 20,21 in FIG. 3.

In summary, the PLL of FIG. 4 must decide which data-valid signal is associated with a data signal transition, so as to place the signal transition in the correct bit cell 14, this being the function of digital data recovery unit 51 whereat data recovery unit 51 looks at input phase and decides which bit cell 14 a signal transition belongs. Because the input phase and the output phase are stored as digital numbers, data recovery unit 51 is needed to change the digitized phase information into a data signal and into a data-valid signal; i.e., into the two standard PLL output signals. Data recovery unit 51 operates to generate a data-valid signal every time the output phase crosses an integer value, and operates to generate a data signal based upon the input phase and the associated bit cell location.

As stated previously, the invention has utility when used to peak detect a PPM recorded data pattern. In this configuration, only a single PLL as shown in FIG. 3 is used, and FIG. 3's signal input conductor 23,24 of this one PLL receives both the PTR and the NTR transitions signal that results from reading the PPM recorded data. In this case the two outputs of data recovery unit 51 are used directly to provide the data-valid and data output signals 33,34 shown in FIG. 3.

Figure 5B:
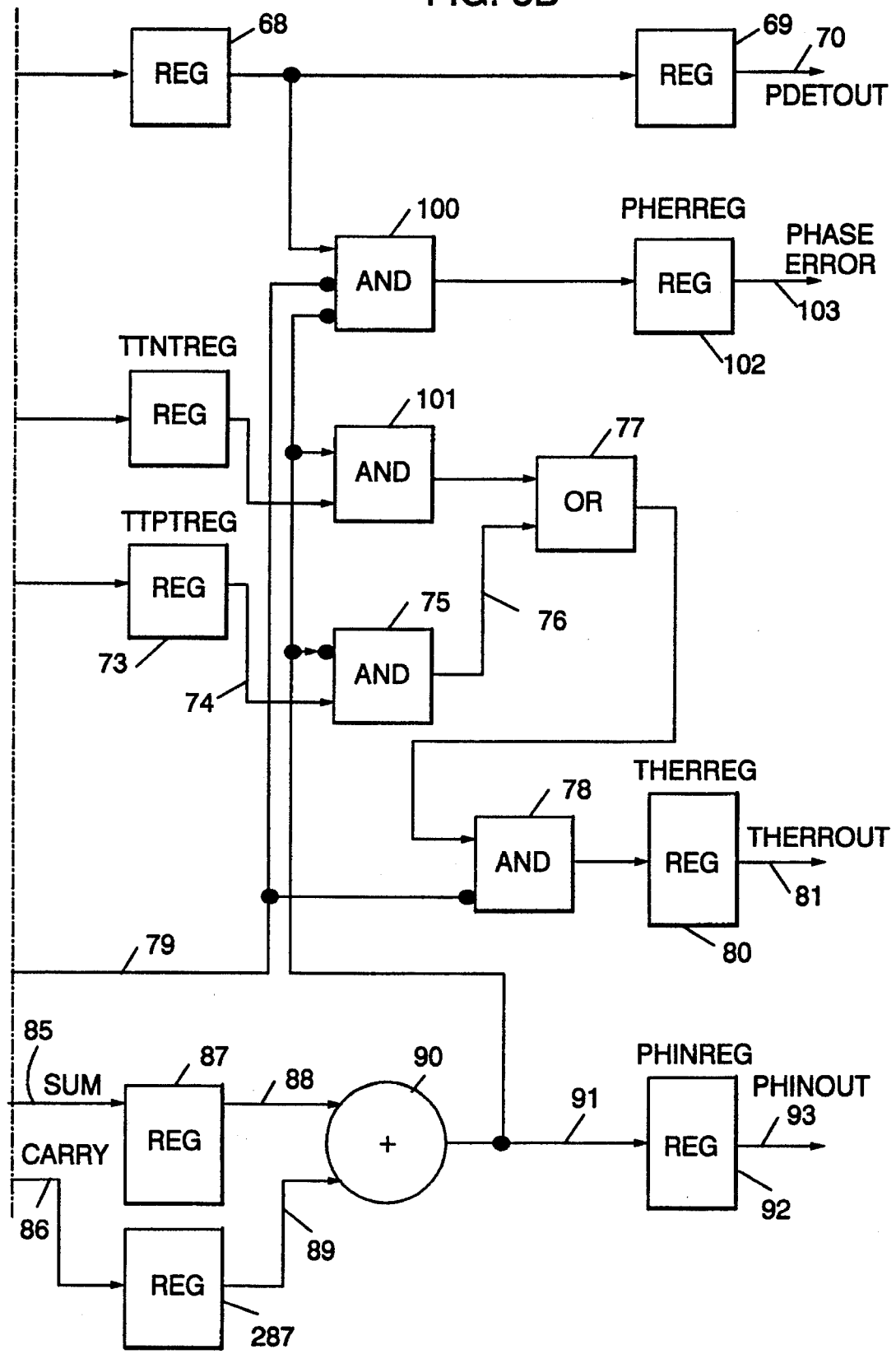

FIG. 5 (consisting of FIGS. 5A and 5B) is a detailed showing of phase detector 40 of FIG. 4; i.e., the phase detector that is contained in each of the two PLLs 20,21 of FIG. 3. Phase detector 40 consists primarily of an input phase estimator 82 (shown in detail in FIG. 6) and PTR/NTR signal transition qualifiers. Phase detector 40 operates to generate a phase error output 103 and an input phase estimate output 93, based upon the current output phase and previous output phase information that is received from FIG. 4's phase integrator 47, and based upon the time of arrival of PAT signal 25. Phase error output 103 and input phase estimate output 93 are generated using first order approximation. Phase error output 103 is truncated to plus or minus 50% of the bit cell.

As seen from FIG. 4, phase detector 40 receives five input signals; namely, (1) either the PTR or the NTR transition signal 23 or 24, (2) PAT signal 25, (3) phase difference signal 48 from digital loop filter 45, (4) current output phase signal 50 from digital phase integrator 47, and (5) previous output phase signal 250 from digital phase integrator 47.

From these five input signals, and as shown in FIG. 4, phase detector 40 provides four output signals, namely (1) phase error signal 31 or 32 to tracking threshold network 19, (2) phase error signal 35 or 36 to the other of the two PLLs, (3) phase error signal 43 to loop filter 45, and (4) input phase estimate signal 52 to data recovery unit 51.

As stated previously, when used in the detection of PWM data, the FIG. 5 phase detector 40 that is within each of the two PLLs 20,21 receives either NTR signal 24 or PTR signal 23, and when used in the detection of PPM data only one PLL is used and it receives both of the transition signals 23 and 24. In the following description of FIG. 5 it will be assumed that phase detector 40 is the phase detector that is within PLL 20; i.e., FIG. 5 shows the phase detector that receives PTR signal 23. In this case OR gate 67 is enabled by PTR signal 23. OR gate 67 operates to set 1-bit register 68, and then 1-bit register 69. Output 70 of register 69 comprises the PDETOUT signal or flag, that is the signal that indicates that the phase error signal 35/36 and the tracking threshold phase error signal 31/32 are valid. In this process, registers 68 and 69 operate as delay matching registers.

PTR signal 23 is also applied to set 1-bit TTPTREG register 73, whose output 74 is applied as one input to AND gate 75. Output 76 of AND 75 operates through OR gate 77 to provide one input to AND gate 78.

In a typical optical disk reading device, one mode of operation may be what is called a coast mode; i.e., a mode of operation that is implemented, for example, when the reading transducer is moving through a defective area of the disk. In FIG. 5 an active signal on conductor 79 indicates that such a mode of operation is underway. As a feature of the invention, the presence of coast signal 79 operates to disable feedback 31,32 to tracking threshold network 57 of FIG. 2, operates to interrupt the phase and frequency output of its PLL, and while the phase and frequency update portions of its PLL are disabled, decoding of data may continue to occur at the fixed frequency rate.

AND 78 responds to the absence of coast mode signal 79 and to the output of OR 77 to set 1-bit THERRREG register 80, whose output 81 comprises the THERROUT or tracking threshold error signal 31/32 of FIG. 4.

Phase detector 40 of FIG. 5 includes an input phase estimator 82 (shown in greater detail in FIG. 6). Input phase estimator 82 receives four inputs; i.e., (1) PAT signal 25, (2) phase difference signal 48 from digital loop filter 45, (3) PDSUM signal 83, and (4) PDCAR signal 84. Signals 83 and 84 comprise the phase delay sum signal 166 and the phase delay carry signal 171 that are provided by phase integrator 47 shown in detail in FIG. 8.

In response to these four input signals, input phase estimator 82 generates the two output signals input-phase-sum 85 and input-phase-carry 86 (i.e., signal 250 of FIG. 4). Output signals 85 and 86 operate to set registers 87 and 287.

The two outputs 88 and 89 of registers 87 and 287 are applied as inputs to carry-look-ahead adder 90, whose output 91 operates to generate 3-bit register 92, whose output in turn comprises PHINOUT output signal 93; i.e., the estimate of input phase signal 52 of FIG. 4.

As shown in FIG. 5B, output 91 from adder 90 is applied to an inverting input of AND 75 (above described), to the inverting input of AND GATE 100 (operative only when the PLL containing the phase detector of FIG. 5 is operating in association with NTR input 24), and to the noninverting input of and gate 101. AND 100 operates in the presence of an output from register 68, and in the absence of both coast signal 79 and output signal 91 from adder 90, to set 6-bit THERREG register 102 and to provide phase error output signal 103. Register 102 indicates plus or minus phase error in a 2's complement representation.

FIG. 6 is a block diagram showing the digital logic of input phase estimator 82 of FIG. 5. Phase estimator 82 operates to implement the following equation:

phase error=(phase difference × time of pulse arrival)+ previous phase where phase difference=present phase−previous phase, or stated differently, Perr=((PresP−PrevP)×Tpat)+PrevP In the structure of the FIG. 6 device, the upper portion comprises a multiplier to implement the function "(PresP−PrevP)×Tpat", whereas the lower portion of FIG. 6 implements the addition function "+PrevP".

Phase difference signal 48 is applied as one input to each of six AND gates 105–110. PAT signal 25 is applied to ANDs 105–110 to selectively enable the ANDs in accordance with the bit content of PAT signal 25. That is, AND 105 is enabled when bit-2 of PAT signal 25 is set (i.e., comprises a binary 1), AND 106 is enabled when bit-3 is set, AND 107 is enabled when bit-4 is set, AND 108 is enabled when bit-5 is set, AND 109 is enabled when bit-6 is set, and AND 110 is set when bit-7 is set.

The outputs of ANDs 106, 107 and 108 are applied as three inputs to full adder 111. The sum and carry outputs 112 and 113 of adder 111 comprise two inputs to full adder 114, the third input comprising the output of AND 105.

The output of AND 110 is applied to one input of full adder 115, its other two inputs comprising PDSUM signal 83 and PDCAR signal 84. The sum and carry outputs 116,117 of adder 115 are applied as two inputs to full adder 118, whose third input comprises the output of AND 109. The sum and carry outputs 119,120 of adder 118 are applied as two inputs to full adder 121, the sum output 122 of adder 114 comprising its third input.

The sum and carry outputs 123,124 of adder 121 comprise two inputs to full adder 126, whose third input comprises the carry output 125 from adder 114. The sum and carry outputs of adder 126 comprise the outputs 85,86 of input phase estimator 82.

Figure 7:
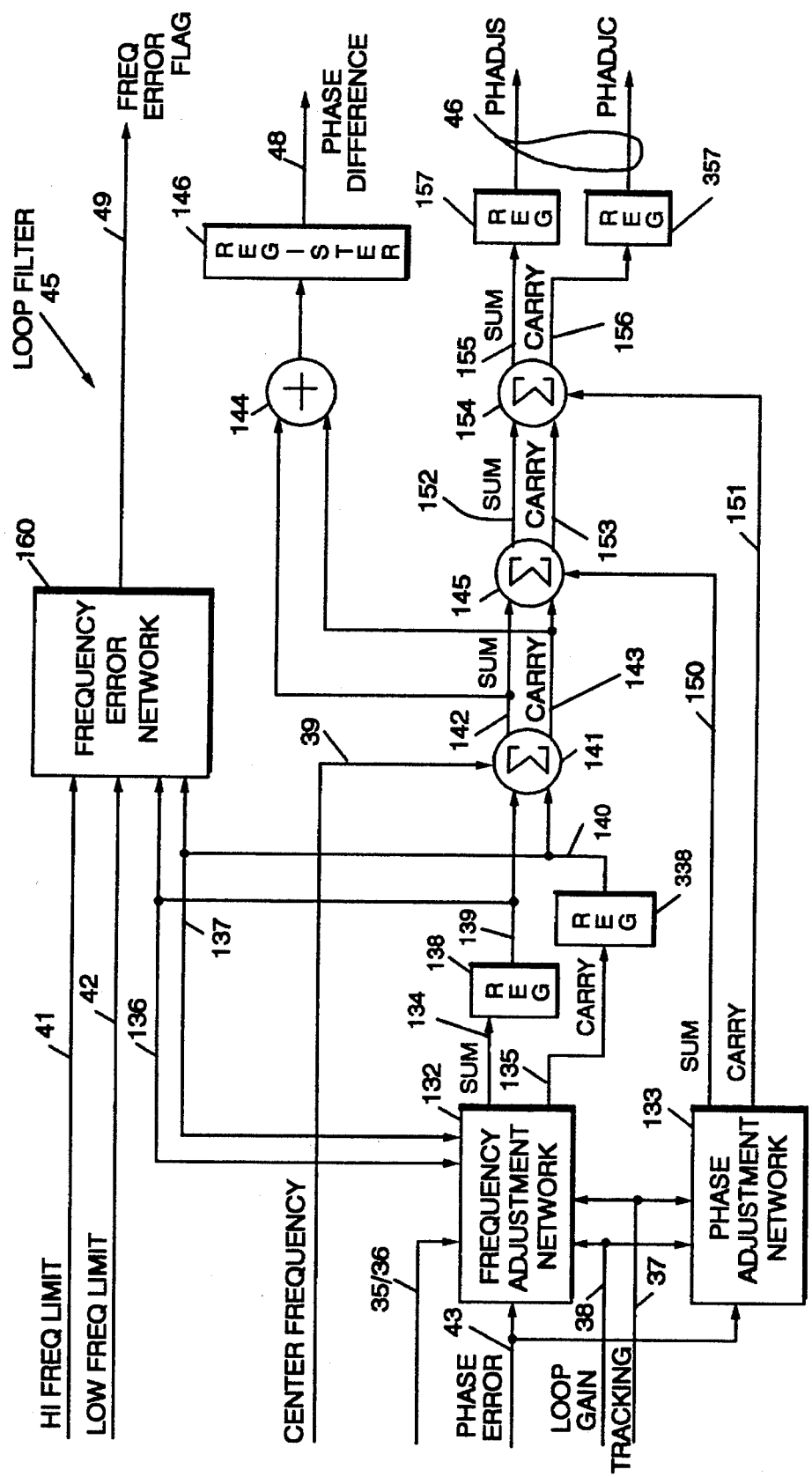
FIG. 7 is a block diagram showing the digital logic within the loop filter of FIG. 4.

FIG. 7 is a block diagram that shows the digital logic within loop filter 45 of FIG. 4. Filter 45 operates to filter and smooth out phase error signal 43. Loop filter 45 is a first order digital filter that, when combined with the closed loop configuration and phase integrator 47 of FIG. 4, provides a second order type II closed loop system for the PLL of FIG. 4. The type II PLL of FIG. 4 operates to track frequency error to zero steady state phase error, and to track phase acceleration to a constant steady state phase error. The transfer function of loop filter 45 is $$D(z)=(A0+A1)z-A1/(z-1)$$

where $(A0+A1)z-A1$ is the phase adjustment at the output 46 of loop filter 45.

With reference to FIGS. 4 and 7, seven inputs are provided to loop filter 45 within a PLL, namely (1) phase error signal 43 from digital phase detector 40, (2) tracking mode signal 37, (3) phase error signal 35/36 that is received from the other PLL, (4) loop gain signal 38 (signal 38 comprises a first component A0 that is applied to frequency adjustment network 132 and a second component A1 that is applied to phase adjustment network 133, wherein A0 determines frequency gain and is usually a small quantity, and wherein A1 determines phase gain and is usually a large quantity), (5) center frequency signal 39, (6) high frequency limit signal 41, and (7) low frequency limit signal 42.

Again with reference to FIGS. 4 and 7, loop filter 47 operates to generate three output signals, namely (1) frequency error flag 49, (2) phase adjust signal 46, and (3) phase difference signal 48.

Loop filter 47 includes a frequency adjustment network 132 and a phase adjustment network 133. Frequency adjustment network 132 operates on the four input signals (1) phase error 43, (2) loop gain 38, (3) tracking 37, and (4) 35/36, and upon the two feedback signals 136,137 that are received from 18-bit register 138,338 to then generate a sum output signal 134 and a carry output signal 135 that are applied to registers 138 and 338, respectively.

Generally speaking, a positive phase error results in the binary number contained in the two registers 138,338 becoming larger, and a negative phase error results in the binary number in these two registers becoming smaller. That is the content of the two registers 138,338 indicate the running frequency steady state frequency error of the PLL.

Registers 138,338 provide two outputs 139,140 to full adder 141 , the other input to adder 141 being center frequency input signal 39 shown in FIG. 4. As a result of these three inputs, adder 141 generates sum and carry outputs 142,143.

Outputs 142,143 of adder 141 are applied both to full adder 145 and carry-look-ahead adder 144. As a result of the two inputs 142,143, adder 144 operates to increment 10-bit register 146, whose output 48 in turn comprises phase difference signal 48 that is applied to digital phase detector 40 of FIG. 4.

Phase adjustment network 133 of FIG. 7 operates upon the three input signals (1) phase error 43, (2) tracking 37, and (3) loop gain 38 to generate two output signals sum 150 and carry 151. Signals 150,151 contain information as to (1) frequency error, (2) phase error, and (3) the bit cell size relative to the sampling rate of the PLL.

The sum output 150 of phase adjustment network 133 is applied as one input to full adder 145, the other two inputs comprising the above-mentioned outputs 142,143 of full adder 141. As a result, adder 145 generates sum and carry outputs 152,153, these outputs being applied as two inputs to full adder 154.

The sum and carry outputs 155,156 of adder 154 are applied as inputs to the two 18-bit registers 157 and 357. Register 157 now operates to generate Phase Adjust Sum Signal (PHADJS) and register 357 now operates to generate the Phase Adjust Carry Signal (PHADJC) that comprise phase adjust signal 46 that is applied to digital phase integrator 47 of FIG. 4. These sum and carry signals operate to cause an advance or a retarding of the PLLs operating phase.

Frequency error flag signal 49 is generated by frequency error network 160, network 160 receiving as inputs (1) high frequency limit signal 41, (2) low frequency limit signal 42, (3) the two outputs 139,140 from registers 138,338. Briefly, network 160 operates to set limits on the operating frequency of the PLL. If the operating frequency goes out of range as is established by signals 41,42, then network 160 operates to set flag 49.

Figure 8:
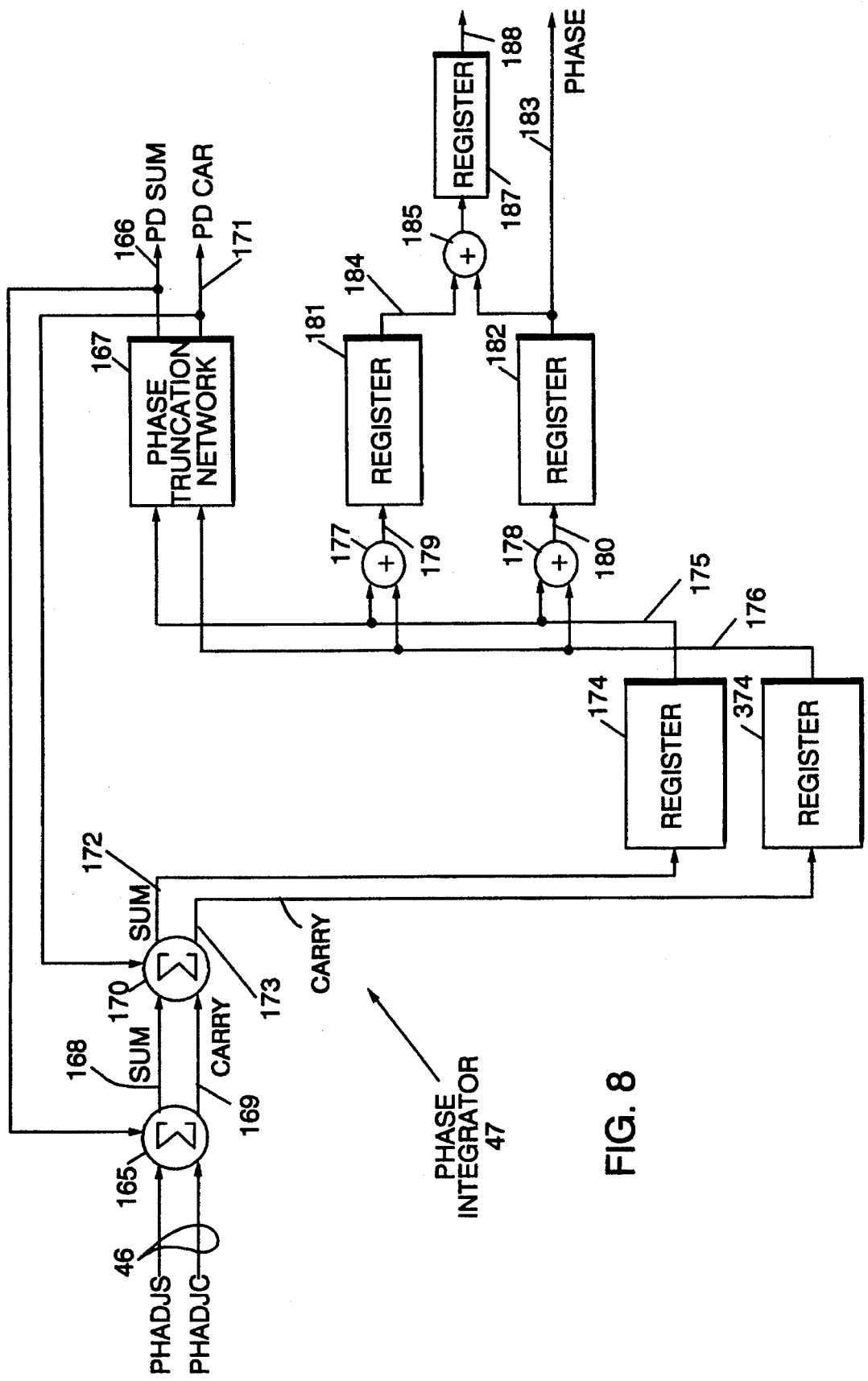
FIG. 8 shows the digital logic of the phase integrator that is shown in FIG. 4.

FIG. 8 shows the digital logic of phase integrator 47 that is shown in FIG. 4. Phase integrator 47 performs the Voltage Controlled Oscillator (VCO) function that is conventionally found in an analog PLL.

As shown in FIGS. 4, 7 and 8, phase integrator 47 receives phase adjust signal 46 as an input. As a result of this input, phase integrator 47 provides FIG. 4's outputs 50 and 250, which output 250 is connected as an input to FIG. 4's digital phase detector 40, and which output 50 is connected as an input to both FIG. 4's digital phase detector 40 and digital data recovery unit 51. Output 50 comprises a first binary signal representing the current output phase. Output 250 comprises a second binary signal representing the previous output phase.

The two output signals 46 of digital loop filter 45 (see FIG. 7) are applied as inputs to full adder 165, a third input to this adder comprising the internal PDSUM or sum output 166 of phase truncation network 167. The sum and carry outputs 168,169 of adder 165 are applied as inputs to full adder 170, the third input to this adder comprising the internal PDCAR or carry output 171 of phase truncation network 167.

As a result of its three inputs, adder 170 produces a sum and a carry output 172,173 which are applied as inputs to an 18-bit SLIM register 174 and a 17-bit CARRY register 374. The two outputs 175,176 of register 174,374 are applied as inputs to phase truncation network 167. Phase truncation network 167 operates to keep only a fractional part of the binary numbers that are stored in registers 174,374, these number representing the current phase. As a result, phase truncation network generates PDSUM and PDCAR outputs 166,167. These two output signals 166,171 are applied as above mentioned internal feedback signals to adders 165, 170, and they also comprise the two input signals 83,84 to FIG. 5's phase detector 40.

In addition, the two outputs 175,176 of registers 174,374 are applied to two carry look ahead adders 177,178. The outputs 179,180 of adders 177,178 are then applied to 1-bit register 181 and to 12-bit register 182.

Output 183 of register 182 comprises the current phase output signal 50 of FIG. 4, i.e. a 12-bit binary signal. Output 183 of register 182 and output 184 of register 181 are applied as two inputs to carry look ahead adder 185, and output 186 of adder 185 is connected to 1-bit register 187. Output 188 of register 187 comprises the previous phase output signal 250 of FIG. 4.

FIG. 9 shows the logic structure of the deskew buffer 22 of FIGS. 2 and 3. Deskew buffer 22 consists of four 4-bit shift registers 189–192 and associated combinatorial logic 193,194 to control these four shift registers. Deskew buffer 22 monitors the data signals 26/28 and the data-valid signals 27/29 that are received from each of the two PLLs 20,21, and operates to generate a data-valid output signal 33 and a data output signal 34 only when the two signals 27/29 and 26/28 have been received on each of its two inputs. Thus, register 216 operates to serialize data-valid signals 27/29 received from PLLs 20,21 on a one-to-one basis, and register 217 operates to serialize data signals 26/28 on a one-to-one basis.

By having a buffer length of four bits, a skew of up to four bits in either direction within a sample cell is tolerated before deskew buffer 22 fails. Of course, as will be appreciated by those of skill in the art, by extrapolating the design that is shown in FIG. 9, deskew buffer 22 can be lengthened to accommodate any number of bits.

Data signals 34 are created by ORing the two data inputs 26/28, wherein one PLL 20 generates data signal 26 only on the rising edge of a media pit, and the other PLL 21 generates data signal 28 only on the falling edge of a media pit (see FIG. 1A). In a like manner, data-valid signals 33 are created by a similar Oring logical operation.

In the construction and arrangement of FIG. 9, the four individual registers 200–203 contain the data-valid pulses 27 that are provided as an output from PLL 20, the four individual registers 204–207 contain the data-valid pulses 29 that are provided as an output from PLL 21, the four individual registers 208–211 contain the data pulses 26 that are provided as an output from PLL 20, and the four individual registers 212–215 contain the data pulses 28 that are provided as an output from PLL 21.

While the invention has been described in detail while making reference to preferred embodiments thereof, it is recognized that those skilled in the art will readily visualize yet other embodiments that are within the spirit and scope of the invention. Thus, the above-detailed description is not to be taken as a limitation of the spirit and scope of the invention.

What is claimed is:

1. A digital channel for use in the threshold detection of a coding modulated binary data stream, comprising;

an input binary data stream having negative and positive transitions that define one binary state of said data stream, a threshold-establishing and transition-detecting network connected to receive said input data stream, said threshold-establishing and transition-detecting network providing an output of one polarity corresponding to detection of a said positive transition, providing an output of a polarity opposite to said one polarity corresponding to detection of a said negative transition, and providing a time-of-arrival output, first and second digital phase locked loop networks, each of said phase locked loop networks having a transition input, a time-of-arrival input, a phase-error input, a data-valid output, and a data output, each of said phase locked loop networks having an internal digital phase detector connected to receive input from said transition input and said time-of-arrival input, and operable to generate a phase-error output, each of said phase locked loop networks having an internal digital loop filter connected to receive input from said phase detector phase-error output, to receive input from said phase-error input, and providing an output to said data-valid output and said data output, means connecting said phase-error output of said first phase locked loop network to said phase-error input of said second phase locked loop network, means connecting said phase-error output of said second phase locked loop network to said phase-error input of said first phase locked loop network, means connecting said output of said one polarity to said transition input of said first phase locked loop network, means connecting said output of said opposite polarity to said transition input of said second phase locked loop network, means connecting said time-of-arrival output to said transition inputs of said first and second phase locked loop networks, and a digital deskew buffer network connected to receive said data-valid outputs and said data outputs of said phase locked loop networks.

2. The channel of claim 1 including;

means connecting said phase-error outputs of said phase locked loop networks to said threshold-establishing and transition-detecting network.

3. The channel of claim 2 wherein said digital deskew buffer network operates to perform a logic OR function on said data-valid and data outputs of said phase locked loop networks.

4. The channel of claim 1 wherein said internal digital loop filters of said digital phase locked loop networks each include;

a frequency adjustment network and a phase adjustment network connected to receive input from said phase detector phase-error output, and said frequency adjustment network additionally connected to receive input from said phase-error input, a full-adder network whereat output from said frequency adjustment network is combined with output from said phase adjustment network to provide a phase adjust output signal, and an internal digital data recovery network within each of said phase locked loop networks connected to receive said phase adjust output signal, and operable in response thereto to generate said data-valid output and said data outputs.

5. The channel of claim 1 including;

an internal digital phase integrator network within each of said phase locked loop networks, each of said phase integrators being connected to receive input from said loop filter, and means connecting said phase integrator network to provide said data-valid output and said data output.

6. A digital channel for use in the detection of a PWM coded data stream, comprising;

a PWM coded data stream having a first transition and a second transition that each define one binary state of said data stream, a threshold-establishing network connected to receive said data stream, and providing an input to a transition detecting network, said transition-detecting network providing an output of one state corresponding to detection of a said first transition, providing an output of a second state corresponding to detection of a said second transition, and providing a transition-time-of-arrival output, first and second substantially identical digital PLL networks, each of said PLL networks having a transition input, a transition-time-of-arrival input, a phase-error input, a data-valid output, and a data output, each of said PLL networks having an internal digital phase detector connected to receive input from said transition input and said transition-time-of-arrival input, and operable to generate a phase-error output, each of said PLL networks having an internal digital loop filter connected to receive said phase-error output, to receive said phase-error input, and providing output to said data-valid output and said data output, means connecting said phase-error output of said first PLL network to said phase-error input of said second PLL network, means connecting said phase-error output of said second PLL network to said phase-error input of said first PLL network, means connecting said transition-detecting network output of said one state to said transition input of said first PLL network, means connecting said transition-detecting network output of said second state to said transition input of said second PLL network, and digital deskew buffer means connected to receive said data-valid outputs and said data outputs of said first and second PLL networks.

7. The channel of claim 6 including;

means connecting said phase-error outputs of said phase detectors that are internal of said first and second PLL networks in controlling relation to said threshold-establishing network.

8. The channel of claim 7 wherein said digital deskew buffer means performs a logic OR function on said data-valid and data outputs of said first and second PLL networks.

9. The channel of claim 8 wherein said digital loop filter internal of each of said first and second PLLs includes;

a frequency adjustment network and a phase adjustment network connected to receive input from said phase detector phase-error output, a full-adder network whereat output from said frequency adjustment network is combined with output from said phase adjustment network to provide a phase adjust output signal, and a digital data recovery network connected to receive said phase adjust output signal, and operable in response thereto to generate said data-valid output and said data output.

10. The channel of claim 9 including;

a digital phase integrator network internal of each of said PLLs, said phase integrator being connected to receive said phase adjust output signal, and means connecting said phase integrator network to provide said data-valid output and said data output.

11. The channel of claim 9 wherein said digital loop filter internal of each of said first and second PLLs includes;

a frequency error network operable to receive signals defining a high frequency limit and a low frequency limit, and operable to receive input from said frequency adjustment network, said frequency error network operating to generate a frequency error flag in the event that said frequency adjustment network indicates a frequency that is outside of a range that is defined by said low frequency limit and said high frequency limit.

12. The channel of claim 6 including;

means selectively operable to inhibit operation of said digital phase detectors that are internal of said first and second PLLs to generate said phase-error output.

13. A digital threshold detection channel for use with a binary data stream having signal transitions that define binary states of said data stream, comprising;

a threshold-establishing and transition-detecting network connected to receive the data stream, said threshold-establishing and transition-detecting network providing an output pulse corresponding to detection of a said signal transition, and providing a time-of-transition-arrival output, a digital phase locked loop network, said phase locked loop network having a transition input, a time-of-transition-arrival input, a data-valid output, and a data output, said phase locked loop network having a digital phase detector connected to receive input from said transition input and said time-of-transition-arrival input, and operable to generate a phase-error output, said phase locked loop network having a digital loop filter connected to receive said phase-error output, and as a result thereof providing output to said data-valid output and said data output, means connecting said output pulse corresponding to detection of a said signal transition to said transition input of said phase locked loop network, means connecting said time-of-transition-arrival output to said time-of-transition-arrival input of said phase locked loop network, and a digital deskew buffer connected to receive said data-valid output and said data output of said phase locked loop network.

14. The channel of claim 13 including;

means connecting said phase-error output of said phase locked loop network to said threshold-establishing and transition-detecting network to thereby control a threshold by which said data stream signal transitions are detected.

15. The channel of claim 14 wherein said digital deskew buffer performs a logic OR function on said data-valid output and said data output of said phase locked loop network.

16. The channel of claim 15 wherein said digital loop filter includes;

a frequency adjustment network and a phase adjustment network connected to receive input from said phase-error output, a full-adder network whereat output from said frequency adjustment network is combined with output from said phase adjustment network to provide a phase adjust output signal, and a digital data recovery network connected to receive said phase adjust output signal, and operable in response thereto to generate said data-valid output and said data output.

17. The channel of claim 16 including;

a digital phase integrator network within said phase locked loop network, said phase integrator being connected to receive input from said loop filter, and means connecting said phase integrator network provide said data-valid output and said data output.

* * * * *